(12) United States Patent
Latham, II et al.

(10) Patent No.: US 8,508,205 B2
(45) Date of Patent: *Aug. 13, 2013

(54) BUCK DC-TO-DC CONVERTER AND METHOD

(75) Inventors: Paul W. Latham, II, Lee, NH (US);
Stewart Kenly, Epping, NH (US)

(73) Assignee: L&L Engineering, LLC, Lee, NH (US)

( * ) Notice: Subject to any disclaimer, the term of this patent is extended or adjusted under 35 U.S.C. 154(b) by 670 days.

This patent is subject to a terminal disclaimer.

(21) Appl. No.: 12/728,458

(22) Filed: Mar. 22, 2010

(65) Prior Publication Data

US 2010/0171479 A1 Jul. 8, 2010

Related U.S. Application Data (63) Continuation-in-part of application No. 11/558,797, filed on Nov. 10, 2006, now Pat. No. 7,696,736.

(60) Provisional application No. 60/735,679, filed on Nov. 11, 2005.

(51) Int. Cl.
*G05F 1/40* (2006.01)

(52) U.S. Cl.
USPC .................. 323/283; 363/127; 307/151

(58) Field of Classification Search
USPC ................ 363/17, 65–71, 127, 132, 98, 86; 323/207, 211, 222, 268, 283; 361/56, 93.9; 307/151
See application file for complete search history.

(56) References Cited

U.S. PATENT DOCUMENTS

| | | | | |
|---|---|---|---|---|
| 4,439,819 A * | 3/1984 | Regan | | 363/17 |
| 4,748,351 A | 5/1988 | Barzegar | | 307/571 |
| 5,162,982 A * | 11/1992 | Mentler | | 363/26 |
| 5,414,341 A * | 5/1995 | Brown | | 323/268 |
| 5,627,460 A * | 5/1997 | Bazinet et al. | | 323/288 |
| 6,127,814 A | 10/2000 | Goder | | 323/282 |
| 6,212,084 B1 * | 4/2001 | Turner | | 363/127 |
| 6,281,743 B1 | 8/2001 | Doyle | | 327/539 |
| 6,441,597 B1 | 8/2002 | Lethellier | | 323/282 |
| 6,856,526 B2 * | 2/2005 | Elek et al. | | 363/86 |
| 6,940,189 B2 * | 9/2005 | Gizara | | 307/151 |
| 6,979,987 B2 | 12/2005 | Kernahan et al. | | |
| 7,696,736 B2 | 4/2010 | Latham et al. | | |
| 2005/0057229 A1 | 3/2005 | Kobayashi | | 323/222 |
| 2005/0140345 A1 | 6/2005 | Iwabuki et al. | | 323/268 |

OTHER PUBLICATIONS

U.S. Appl. No. 60/735,679, Latham et al.

(Continued)

*Primary Examiner* — Rajnikant Patel (57) ABSTRACT

A method and apparatus for converting a DC voltage to a lower DC voltage, provides for conducting current from an input terminal, through an inductor to charge a capacitor connected to the inductor at an output terminal and to provide a varying range of load current from the output terminal, alternately switching the input terminal between a supply voltage and a ground potential to produce a desired voltage at the output terminal that is lower than the supply voltage, while providing the varying range of load current, and disconnecting the input terminal from both the supply voltage and the ground potential to reduce an increase in voltage at the output terminal caused by a substantial reduction in the load current, while current through the inductor adjusts in response to the reduced load current.

13 Claims, 10 Drawing Sheets

(56) References Cited

OTHER PUBLICATIONS

Walker, G. et al., An Isolated MOSFET Gate Driver, In Australasian Universities Power Engineering Conference, AUPEC 1996, vol. I, pp. 175-180.

Balogh, L. Design and Application Guide for High Speed MOSFET Gate Drive Circuits, Proc. Power Supply Design Seminar (SEM 1400), 2001.

IGBT/MOSFET Gate Drive Optocoupler, Vishay Semiconductor Application Note No. 81227, Rev. 1.2, May 20, 2009.

Andreycak, B. "Practical Considerations. In High Performance MOSFET, IGBT and MCT Gate Drive Circuits", Unitrode Corporation, Application Note U-137, 2001.

Motto, E. et al., Hybrid ICs Drive High-Power IGBT Modules, Power Electronics Technology, Mar. 2005, pp. 24-34.

International Search Report dtd. Feb. 12, 2008 for PCT/US06/60806 filed Nov. 10, 2006. Applicants: L&L Engineering LLC.

Extended European Search Report dtd. Jul. 15, 2009 for EP 06839843.7 filed Nov. 10, 2006. Applicants: L&L Engineering LLC.

\* cited by examiner

BUCK DC-TO-DC CONVERTER AND METHOD

CROSS REFERENCE TO RELATED APPLICATIONS

This application is a continuation-in-part of co-pending U.S. patent application Ser. No. 11/558,797, filed Nov. 10, 2006, entitled BUCK DC TO DC CONVERTER AND METHOD, which in turn claims priority of U.S. Provisional Application Ser. No. 60/735,679, filed Nov. 11, 2005, entitled INTEGRATED, FAST-DISCHARGE BUCK CONVERTER, both of which are hereby incorporated by reference in their entirety.

BACKGROUND

The present teachings relate generally to the field of buck converters, and more particularly, to switching control thereof.

These teachings relate to switching power supplies (switching converters). These devices are used to efficiently transform voltage and currents at one level to voltage and currents at a different level. Switching converters are particularly important when either high power or battery operation require high efficiency. Switching converters are pervasive throughout many consumer products such as cell phones, PDAs, personal computers, etc. A key feature of the switching power supply is its small size and low cost, which is achieved thru efficient design.

One of the ways to improve the size and cost of switching converters is to optimize the size of the external passive components. This is achieved by optimizing power device topology.

With the advent of deep sub-micron CMOS, power supplies with very low voltage, high tolerance and high currents are required. As a result, passive filter components have to be scaled to a very low impedance, and in particular the output capacitor is selected to be of high quality and large value. This capacitor dominates the size and cost of the switching converters for sub-micron CMOS. In general, a smaller the capacitor means lower cost.

There is a need for power device topologies that allow the output capacitor to be reduced.

Buck DC-to-DC converters are frequently used to provide lower operating voltages as required in various devices that use integrated circuits. Typically a much larger supply voltage is used with a narrow duty cycle to charge an output capacitor through an inductor, with accumulated inductor current maintaining the output voltage when not connected to the higher voltage supply during the off portion of the duty cycle.

This arrangement of having a higher supply voltage for charging the inductor current and a much smaller output voltage for discharging the inductor current causes the step load recovery to be asymmetrical. When the load current steps from the small value to near its maximum value, the voltage across the inductor is the supply voltage minus the output voltage. In this case, the relatively large supply voltage allows the inductor to be charged quickly, and the corresponding output voltage droop is minimized.

When the load current steps from near its maximum value to near its minimum value, the voltage across the inductor is just the output voltage. This relatively small voltage discharges the inductor slowly. This has the unfortunate result of allowing a large output voltage overshoot. This is an inherent limitation of the fundamental buck converter structure.

One method to avoid this problem employs discrete MOSFETs to allow the bulk diode of the synchronous rectifier FET to turn on for a short time. This increases the discharge voltage by the turn-on voltage of the bulk diode. Unfortunately this method is not typically available in the integrated circuit form. In integrated circuit power devices, it is desirable not to turn on the bulk diodes for latch-up reasons. Latch-up is self destructive in most integrated circuits and efforts are made to avoid it. In addition, the improvement in the discharge rate is only increased by the addition of a diode forward drop.

For the above reasons, it would be beneficial to provide improved methods and devices for discharging built up inductor current in buck converters when the converter experience is a substantial drop in load current being drawn there from, without using a larger capacitor to store the extra charge.

SUMMARY

The needs of the teachings set forth above as well as further and other needs and advantages of the present teachings are achieved by the embodiments of the teachings described herein below.

In one embodiment, a DC-to-DC buck converter comprises an inductor coupled between an input terminal and one end of a capacitor to conduct an inductor current to the capacitor to produce an output voltage across the capacitor and provide a varying range of load current; a first switch adapted to connect the input terminal to a voltage source; a second switch adapted to connect the input terminal to ground; and a control circuit adapted to control the first and second switches to provide a normal operating sequence to alternatively connect the input terminal to either the voltage source or to ground in response to the output voltage to provide the varying range of load current, wherein the control circuit is adapted to open both the first and second switches together to reduce an increase in the output voltage caused by a substantial reduction in the load current.

The control circuit may be adapted to keep the first switch off and to modulate the second switch to reduce an increase in the output voltage caused by the substantial reduction in the load current.

The converter may further comprise a reverse bias bypass circuit connected across the second switch and adapted to limit voltage across the second switch when the input terminal exhibits a reversed or negative voltage while current through the inductor adjusts to the substantial reduction in the load current. The bypass circuit may include a serially opposed diode and zener diode, wherein the diode is reversed biased during the normal operating sequence and forward biased to a reversed biased zener diode when the inductor terminal exhibits a reversed or negative voltage while current through the inductor is adjusting to the substantial reduction in the load current.

The second switch may be a MOSFET having an isolated bulk, a MESFET having an isolated bulk, an IGBT, a MESFET, a MOSFET, or a bipolar transistor. The converter may further comprise a separate diode connected from each source and drain electrode of the MOSFET to the bulk dielectric and adapted to prevent forward bias of bulk semiconductor junctions in the MOSFET. Each of the separate diodes may be a Schottky diode. The second switch may be a p-bulk MOSFET having an n-well isolated bulk region.

The first and second switches and the control circuit may be constructed as part of the same integrated circuit. The second switch may be constructed as part of a separate integrated circuit from the controller circuit to enhance heat dissipation from the second switch. The second switch may include a pair of series connected N-well MOSFETS having commonly connected source and p-well terminals.

The converter can also include a first gate driver circuit for switching the first switch and a second gate driver circuit for switching the second switch. In one instance, the first and second gate driver circuits are integrated with the control circuit. In one embodiment, the second gate driver circuit provides a voltage lower than a source voltage. In another embodiment, a comparator circuit is operatively connected to the input terminal and compares input terminal voltage to a predetermined voltage; the comparator circuit asserting a signal when the input terminal voltage exceeds the predetermined voltage. The controller, upon receiving the asserted signal, provides a turn on switch voltage to the second switch.

In another embodiment, a method for converting a DC voltage to a lower DC voltage includes the steps of: conducting current from an input terminal, through an inductor to charge a capacitor connected to the inductor at an output terminal and to provide a varying range of load current from the output terminal; alternately switching the input terminal between a supply voltage and a ground potential to produce a desired voltage at the output terminal that is lower than the supply voltage, while providing the varying range of load current; disconnecting the input terminal from both the supply voltage and the ground potential to reduce an increase in voltage at the output terminal caused by a substantial reduction in the load current, sensing voltage at the input terminal and reconnecting the input terminal to ground if the voltage at the input terminal exceeds a predetermined amount.

The step of alternately switching may include the steps of switching the input terminal to ground using a MOSFET having a isolated bulk and protecting semiconductor junctions with the isolated bulk within the MOSFET from becoming forward biased by reverse voltage at the input terminal including bypassing the semiconductor junctions with individual Schottky diodes having a lower forward bias threshold voltage than the semiconductor junctions of the isolated bulk.

In yet another embodiment, the method for converting a DC voltage to a lower DC voltage includes the steps of: conducting current from an input terminal, through an inductor to charge a capacitor connected to the inductor at an output terminal and to provide a varying range of load current from the output terminal; alternately switching the input terminal between a supply voltage and a ground potential to produce a desired voltage at the output terminal that is lower than the supply voltage, while providing the varying range of load current, disconnecting the input terminal from both the supply voltage and the ground potential to reduce an increase in voltage at the output terminal caused by a substantial reduction in the load current and limiting the amount of reverse voltage that can be produced at the input terminal while inductor current is adjusting in response to the substantial reduction in load current, the limiting the amount of reverse voltage includes the step of providing, to a semiconductor switching device used to connect the input terminal to the ground potential, a gate voltage lower than an input terminal voltage.

The control circuit may be adapted to open the first and second switches to reduce an increase in the output voltage caused by the substantial reduction in load current. The converter may further comprise a reverse bias bypass circuit connected across the second switch and adapted to limit reverse voltage across the second switch when the input terminal exhibits a reversed or negative voltage. The bypass circuit may include a serially opposed diode and zener diode, wherein the diode is reversed biased during the normal operating sequence and forward biased to a reversed biased zener diode when the inductor terminal exhibits a reversed or negative voltage.

The second switch may be a MOSFET having an isolated bulk. The converter may further comprise a separate diode connected from each source and drain electrode of the MOSFET to the bulk dielectric and adapted to prevent forward bias of bulk semiconductor junctions in the MOSFET. The second switch may be a p-bulk MOSFET having an n-well isolated bulk region.

The first and second switches and the control circuit may be constructed as part of the same integrated circuit. The second switch may be constructed as part of a separate integrated circuit from the controller circuit to enhance heat dissipation from the second switch. The second switch may include a pair of series connected N-well MOSFETS having commonly connected source and p-well terminals In still another embodiment, a method for converting a DC voltage to a lower DC voltage, comprises the steps of: conducting current from an input terminal, through an inductor to charge a capacitor connected to the inductor at an output terminal and to provide a varying range of load current from the output terminal; alternately switching the input terminal between a supply voltage and a ground potential to produce a desired voltage at the output terminal that is lower than the supply voltage, while providing the varying range of load current including the step of allowing a reverse to voltage to form on the input terminal to reduce an increase in voltage at the output terminal caused by a substantial reduction in the load current.

The method may further comprise the step of keeping the input terminal disconnected from the supply voltage while inductor current adjusts in response to the substantial reduction in load current.

The may further comprise limiting the amount of reverse voltage that can be produced at the input terminal while inductor current is adjusting in response to the substantial reduction in load current. The method may further comprise the step of bypassing a semiconductor switching device used to connect the input terminal to the ground potential with one or more components adapted to limit reverse voltage produced at the input terminal with respect to the ground potential.

The step of alternately switching may include the steps of switching the input terminal to ground using a MOSFET having a isolated bulk and protecting semiconductor junctions with the isolated bulk within the MOSFET from becoming forward biased by reverse voltage at the input terminal including bypassing the semiconductor junctions with individual Schottky diodes having a lower forward bias threshold voltage than the semiconductor junctions of the isolated bulk.

BRIEF DESCRIPTION OF THE DRAWINGS

For a better understanding of the present teachings, together with other and further objects thereof, reference is made to the accompanying drawings and detailed description and its scope will be pointed out in the appended claims.

DETAILED DESCRIPTION

Figure 1:
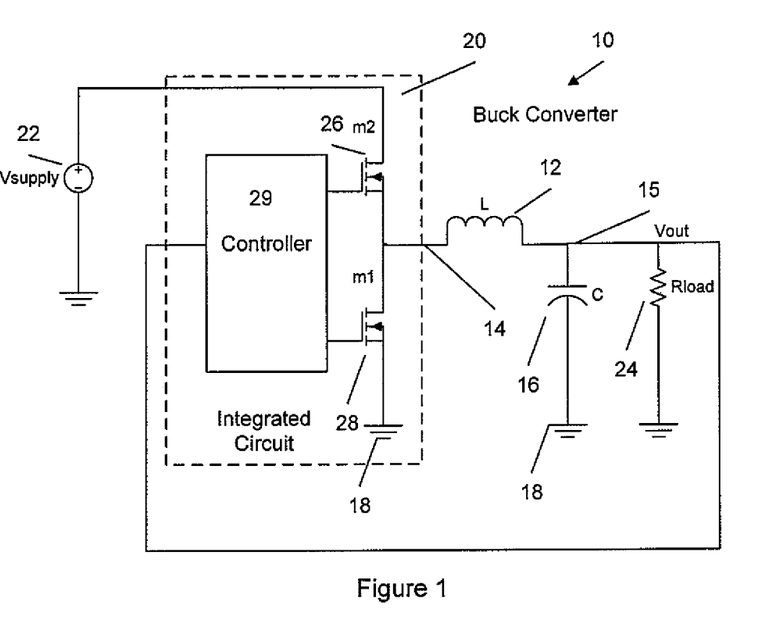
FIG. 1 is a circuit schematic diagram of a DC-to-DC buck converter constructed in accordance with the prior art.

FIG. 1 shows a classic prior art buck converter 10 generally including an inductor 12 connected between an input terminal 14 and an output terminal 15, a capacitor 16 connected between output terminal 15 and ground 18 and a controller integrated circuit 20. Also shown are a supply voltage source 22 and a nominally represented load 24. Integrated circuit 20 includes a pair of switches 26, 28 and a switching controller 29. Switch 26 is connected to selectively couple input terminal 14 to voltage supply 22, and is referred to herein as supply voltage or supply source switch 26. Switch 28 is connected to selectively couple input terminal 14 to ground 18 and is referred to herein as synchronous rectifier switch 28. Switches 26, 28 are, in one embodiment, MOSFETS having a bulk connection to their respective source terminals and, in other embodiments, MESFETS having a bulk connection to their respective source terminals, or an IGBT, MESFET, MOSFET, or a bipolar transistor. Switching controller 29 determines the duty cycle for controlling switches 26, 28 in response to the output voltage at terminal 15. Various different switching controller topologies and methodologies exist for this purpose. Different approaches may be used to depending upon the load current demands placed upon the converter, such as a steady state load current versus a significant load current range, wherein the actual current can change rapidly.

Figure 2:
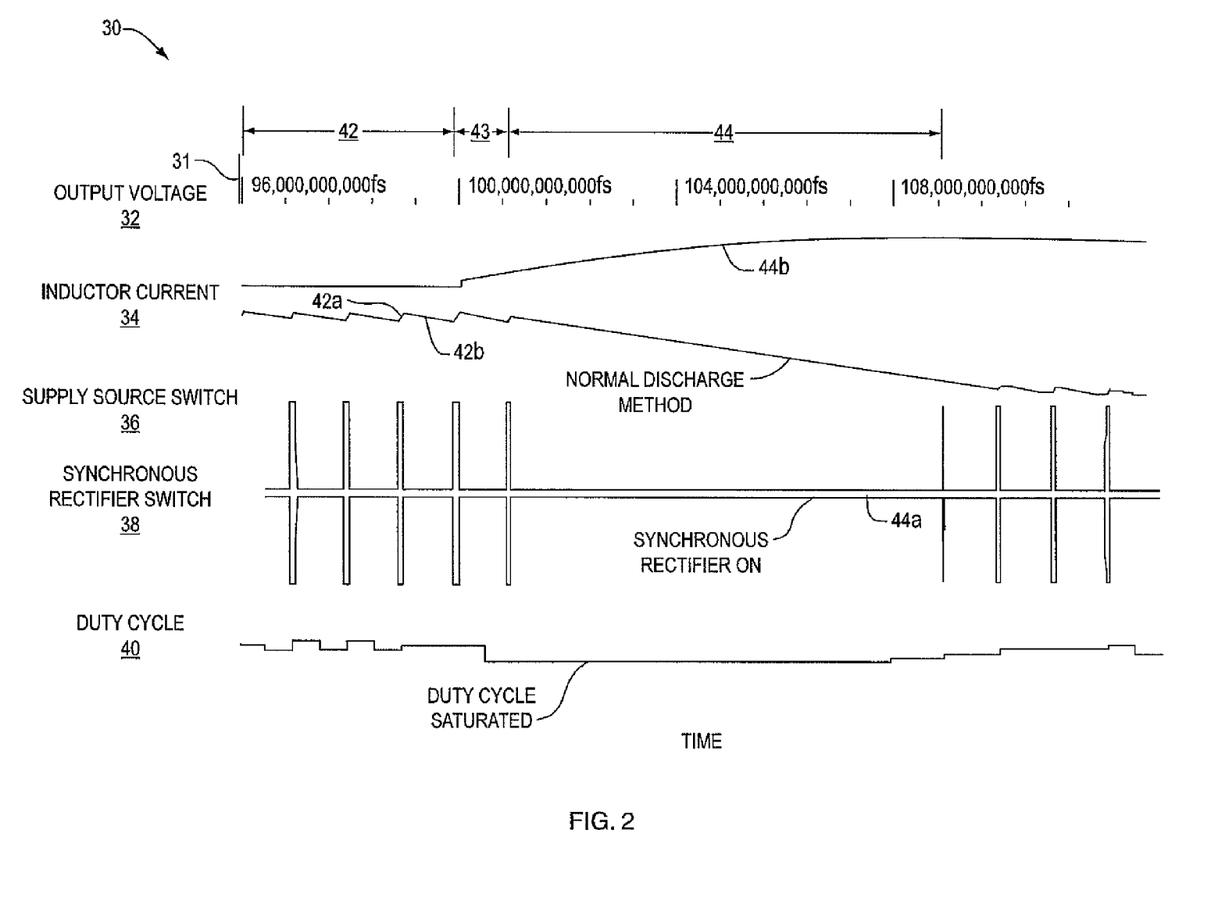
FIG. 2 is a plot of various voltages and an inductor current which occur within the buck converter of FIG. 1, both during normal mode operation and during a substantial reduction in load current.

FIG. 2 shows the operation of buck converter 10 by plotting various voltages and the inductor current. The various plots 30 include time frame 31, output terminal voltage 32, inductor current 34, supply source switch modulation 36, synchronous rectifier switch modulation 38 and duty cycle 40. Plots 30 are shown over time to include different operating conditions of converter 10. Time segment 42 shows normal mode operating conditions for converter 10, with source switch modulation 36 and rectifier switch modulation 38 showing alternate switching of input terminal 14 between supply voltage 22 and ground 18. Correspondingly, inductor current 34 rises briefly 42a, while supply voltage switch 26 is conducting and drops 42b while rectifier switch 28 is conducting.

Time point 43 represents a substantial decline in load current being drawn by load 24, which results in an increase in voltage produced at output terminal 15 from the stored energy in inductor 12. Inductor current 34 gradually declines over time period 44, as rectifier switch 28 remains closed 44a and output terminal voltage 32 remains high 44b. Duty cycle plot 40 represents the operation of a normal duty cycle controller and essentially flat-lines during time interval 44 while inductor current is still slowly adjusting to the substantial reduction in load current.

Figure 3:
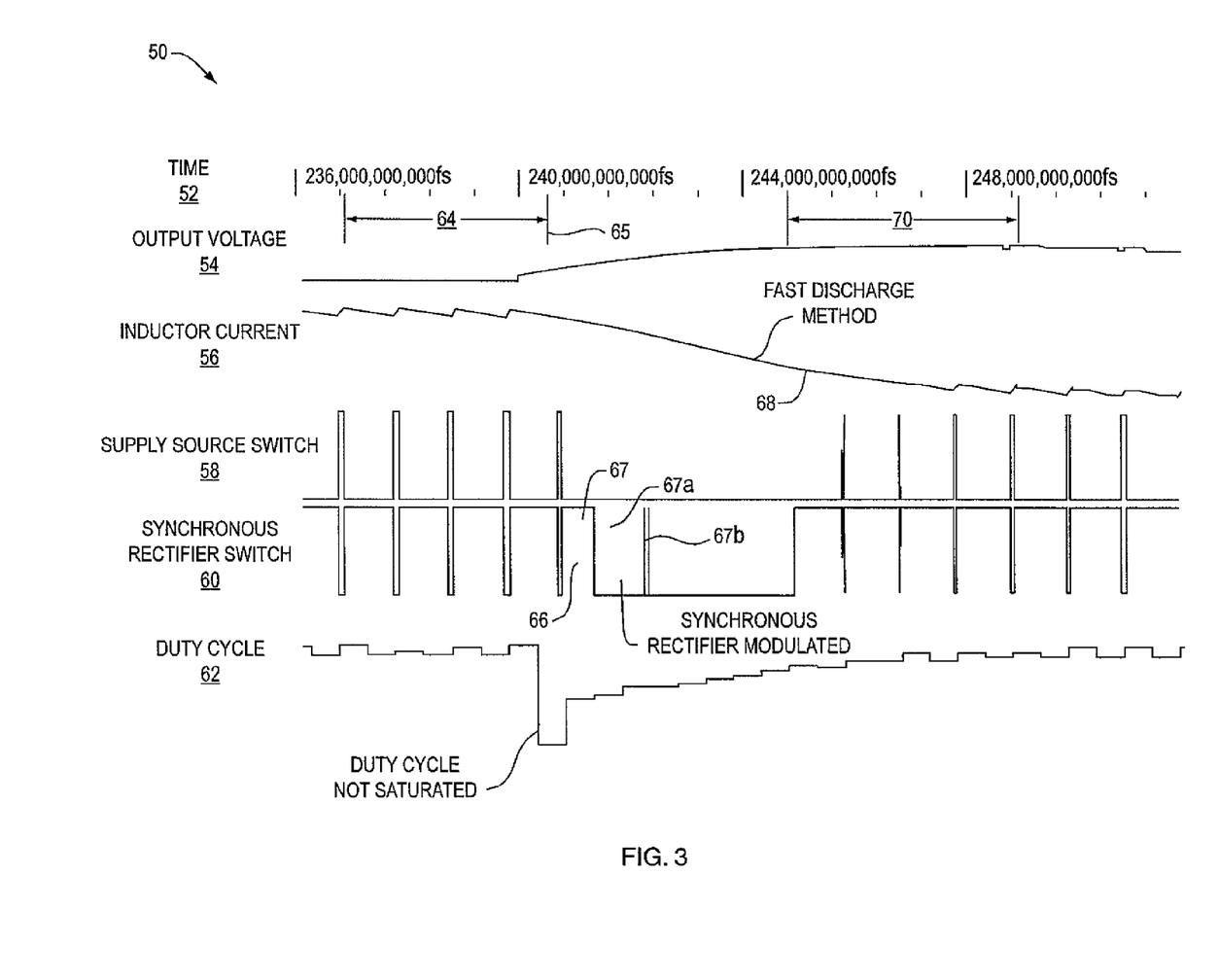
FIG. 3 is a plot of various voltages and inductor current produced within a buck converter functioning in accordance with one embodiment of the present teachings.

FIG. 3 shows plots 50 of the operation of a DC-to-DC buck converter 10 in accordance with one embodiment of the present teachings. This method of operation is programmed into controller 29. In one distance, the controller 29 includes one or more processors and one or more computer usable media, where the computer usable media has computer readable code embodied therein, the computer readable code cause them to one or more processors to execute the methods of these teachings. The plots shown include time 52, output voltage 54, inductor current 56, supply source switch modulation 58, synchronous rectifier switch modulation 60 and duty cycle 62. Time period 64 shows normal mode rectifier operation, with modulation plots 58, 60 indicating that input terminal 14 is being alternately switched between supply voltage 22 and ground 18. Inductor current plot 56 shows the same variation as previously described during normal mode converter operation.

Time point 65 represents a substantial reduction in load current, in response to which inductor current begins to decline and output terminal voltage increases. Synchronous rectifier modulation plot 60 shows switch 28 being turned on during periods 66, 67 to connect input terminal 14 to ground 18. At time point 67a, switch 28 is turned off and remains off, which allows the voltage at input terminal 14 to go negative, which causes reverse conduction in switch 28 and thus an increased voltage drop between terminal 14 and ground 18. The negative or reversed voltage causes a significant increase in negative inductor current to draw down the voltage at output terminal 15 more rapidly. This lowers the maximum value of the output terminal voltage thereby affording some over-voltage protection to load 24. In one instance, the semiconductor switching device 28 used to connect the input terminal to the ground potential is provided a gate voltage lower than the input terminal voltage. The rectifier switch modulation plot 60 shows further modulation of switch 28 at its time 67b. Such additional modulation may be programmed into controller 29 in accordance with the known inductor current decline characteristics of the load for which the converter is intended. Once the inductor current in plot 56 has declined to a suitable level 68 in response to the reduced load current, the normal mode modulation of switches 26, 28 can begin over period 70. In one instance, the voltage at the input terminal is sensed and compared to a predetermined voltage, where the predetermined voltage is indicative of declined (and almost extinguished) inductor current, and the input terminal is reconnected to ground (through switch 28) if the voltage at the input terminal exceeds the predetermined voltage. The duty cycle plot 62 shows active duty cycle control being generated while inductor current is adjusting to the reduced load current.

Figure 4:
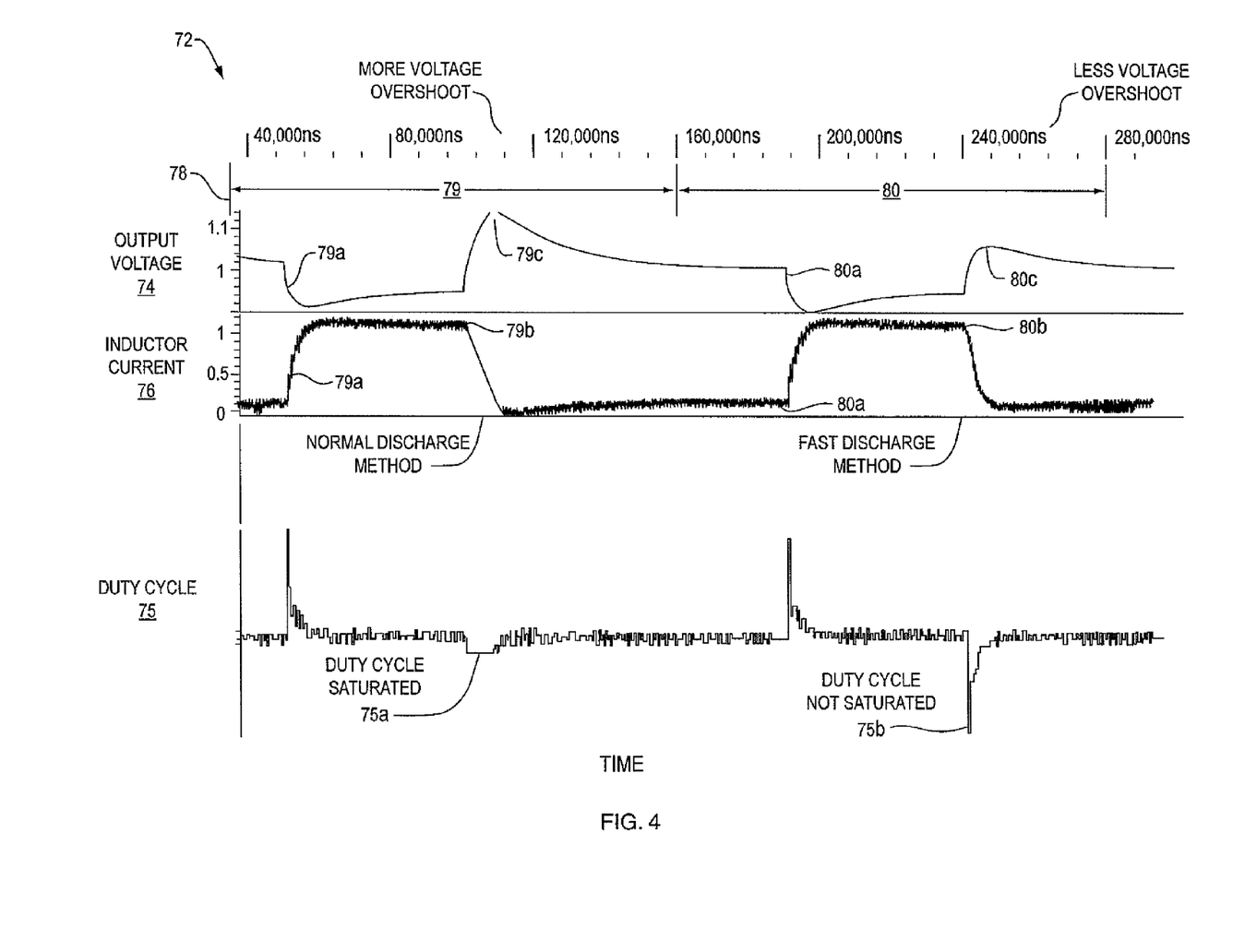
FIG. 4 is a plot of output voltage versus inductor current over two cycles of a substantial reduction in the load current, with the first cycle not implementing the present teachings and the second cycle implementing an embodiment of the present teachings and exhibiting less voltage overshoot than of the first cycle.

FIG. 4 shows a plot 72 of output voltage 74, inductor current 76 and duty cycle activity 75, over time 78 including two sequential time periods 79, 80 which use two different control methods. Period 79 shows a sharp increase in load current 79a followed by a substantial decline in load current 79b. At point 79c, the output voltage, or output terminal voltage in plot 74 exhibits a significant overshoot due to the reduction in load current. Time period 80 also shows a load current increase at time point 80a followed by a substantial reduction in load current at point 80b. In time period 80 however, the switch method described in reference to FIG. 3 is employed resulting in a smaller increase 80c in the output terminal voltage of plot 74. Duty cycle plot 75 shows a mathematical saturation at zero at point 75a. Duty cycle plot 75 also shows the controller producing negative numbers at 75b thereby commanding the new behavior in switch 28 while using the method of the present teachings.

The determination of a substantial drop in load current may be made by any suitable method. There are a wide variety of known methodologies for controlling duty cycles in buck converters, which generally include monitoring the output voltage over time, generally because of the great variety of load current demands for which such circuits are designed. For this reason, the determination of when a substantial drop in load current exists can have some variety of specific definitions. The present teachings are not intended to be limited to any specific definition of substantial reduction in load current.

Figure 5:
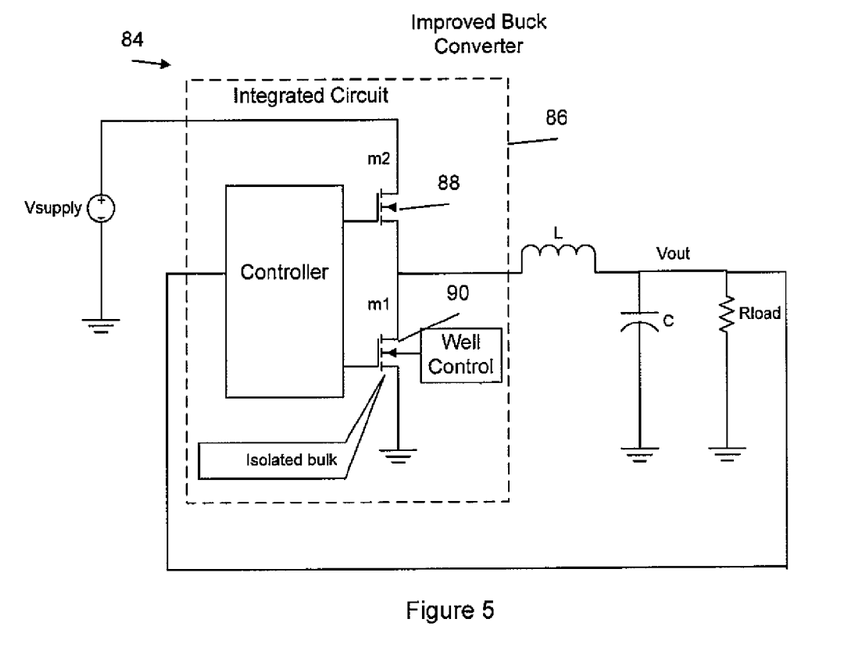
FIG. 5 is a schematic diagram illustrating one embodiment of the present teachings.

FIG. 5 shows another DC-to-DC buck converter 84 having a different switching and control semiconductor 86. Semiconductor 86 includes a pair of MOSFET switches 88, 90 for alternately connecting input terminal 92 between a supply voltage and ground. However, MOSFET switches 88, 90 have P-bulk terminals 88a, 90a, which are allowed to float or are otherwise controlled to maintain the semiconductor junctions with the bulk in each MOSFET in a reverse bias condition when the voltage at input terminal 92 is reversed, or driven negative, from its normal mode operating values. In extreme cases of larger reductions in load current, accumulated energy or current in the inductor can cause significant negative or reverse voltage to appear at input terminal 92 while terminal 92 is not connected to ground in accordance with one embodiment of the present teachings. This voltage can forward bias semiconductor junctions with the MOSFET switch 28 bulk and result in significant forward bias current in rectifier switch 28. This can cause overheating and damage in integrated circuit 86. Controlling the biasing of bulk terminals 88a, 90a is one way of preventing forward biasing of the MOSFET bulk junctions and resulting overheating.

Figure 6:
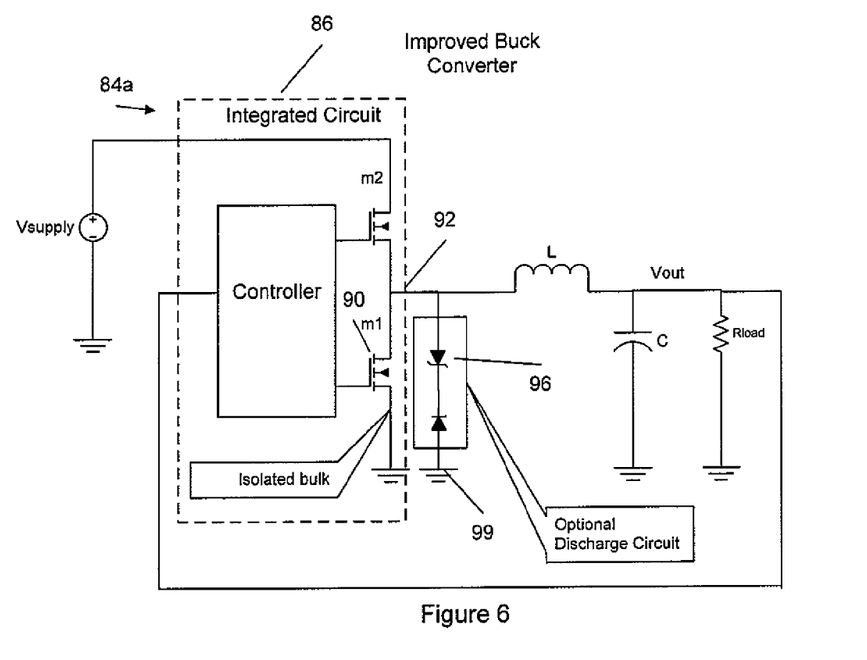
FIG. 6 is a schematic diagram illustrating another embodiment of the present teachings.

FIG. 6 shows a modified converter schematic 84a having the same basic components as converter 84 of FIG. 5 with the addition of a forward bias bypass circuit 96 connected between input terminal 92 and ground 99. Bypass circuit 96 includes a series connected Zener diode 97 and regular diode 98 having reversed polarity and coupled to input terminal 92 to be reversed biased and non-conducting during normal mode operation of converter 84a and to be forward biased and conducting with a predetermined voltage drop when negative or reversed voltages are created at input terminal 92. The predetermined voltage drop is set by the reversed bias Zener voltage plus the forward biased normal diode voltage drop, and limits the maximum negative or reversed voltage that can be formed on input terminal 92 by declining inductor current. This predetermined voltage is used in conjunction with the floating P-bulk terminals to prevent forward biasing of MOSFET 90 by negative or reversed voltage on input terminal 92. When the predetermined negative or reverse voltage is reached at input terminal 92, bypass circuit conducts current from input terminal 92 to ground 99, thereby providing a negative or reversed voltage bias at input terminal 92 to reduce the output terminal voltage and also bypass switch 90 and avoid overheating of integrated circuit 86.

Figure 7:
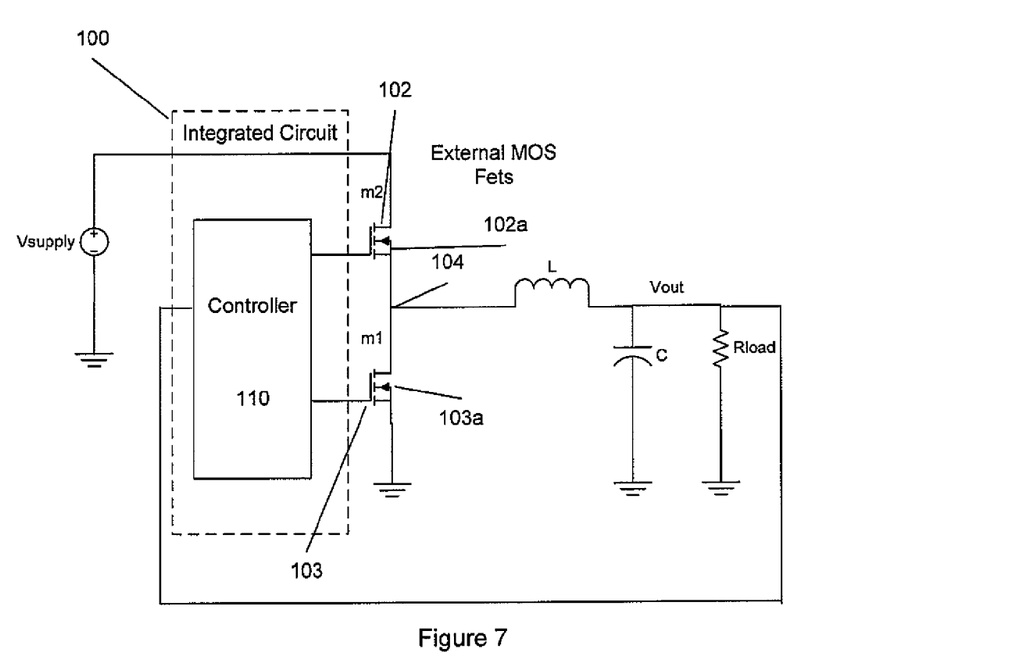
FIG. 7 is a schematic diagram illustrating yet another embodiment of the present teachings.

FIG. 7 shows another configuration of a buck converter 100 having semiconductor MOSFETS 102, 103 for switching of input terminal 104 in response to controller 106. MOSFETS 102, 103 are constructed in separate semiconductor substrate from controller 106, thus preventing forward bias bulk junction current flow from overheating controller 106. In this case, the bulk terminals 102a, 103a are connected to their respective source terminals to allow forward biasing of the bulk junctions by negative or reversed voltage on input terminal 104. In this configuration the negative or reverse voltage on input terminal 104 is limited to the bulk junction forward bias voltage drop.

Figure 8:
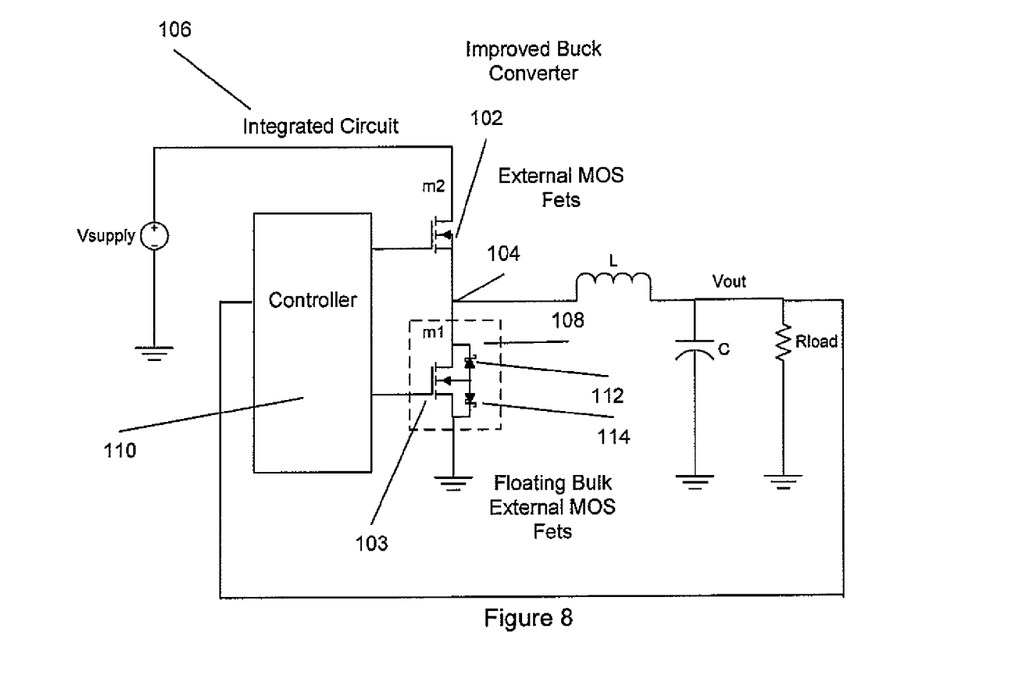
FIG. 8 is a schematic diagram illustrating a modification of the embodiment of FIG. 7.

FIG. 8 shows a further modification of converter 106 using MOSFETS 102, 103 constructed in a separate substrate 108 from controller 110. MOSFET 103 further includes bypass diodes 112, 114. Diodes 112, 114 are Shottky diodes having faster switching and lower forward bias voltage drop than normal diode junctions, including the bulk junctions of MOSFET 103. They are connected to MOSFET 103 to be reversed biased during normal mode operation of converter 100 and to be forward biased by negative or reverse voltage appearing on input terminal 104. Their lower forward bias voltage drop bypasses the bulk conjunctions and prevents overheating in MOSFET 103.

Figure 9:
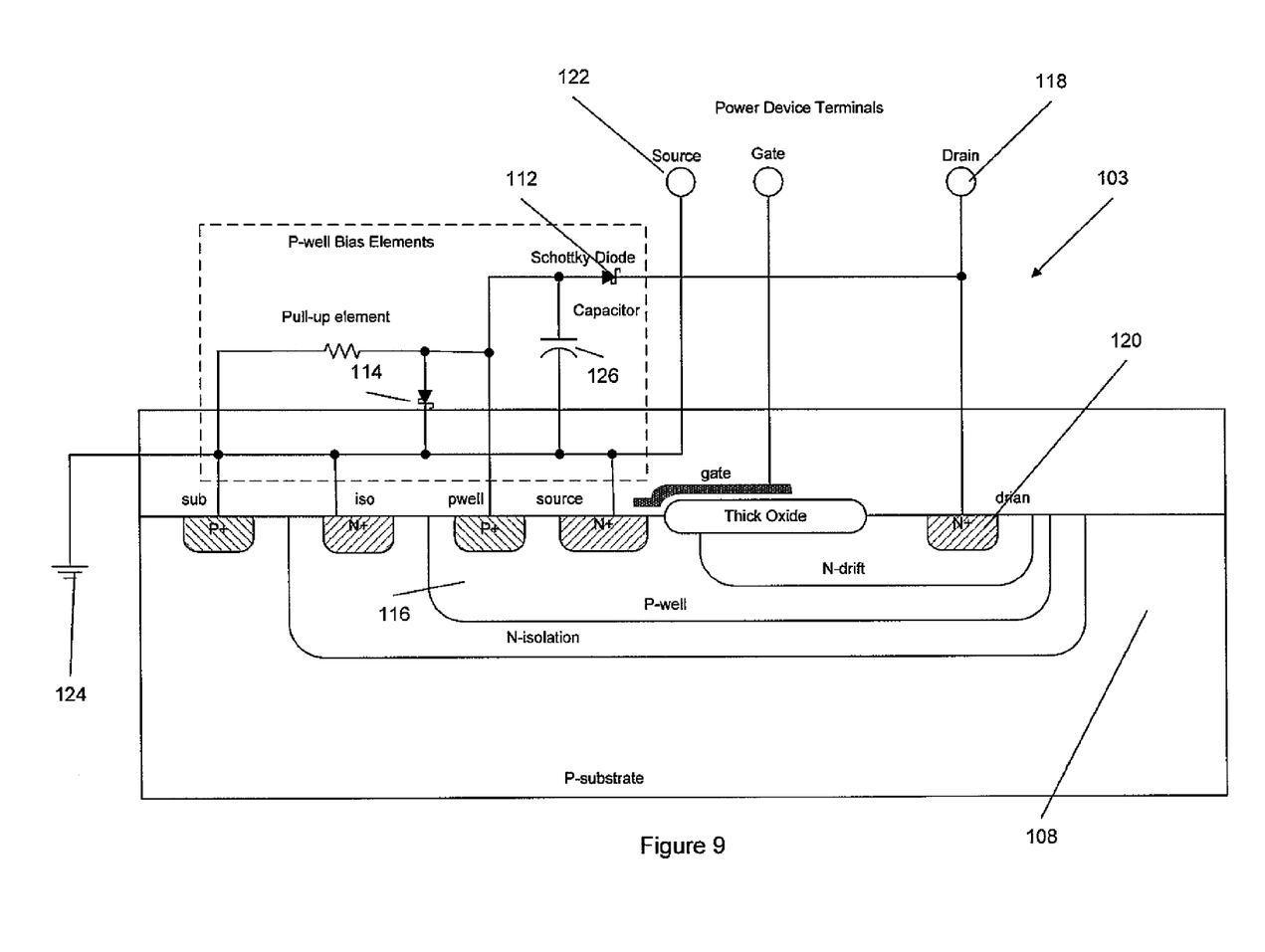
FIG. 9 is a schematic cross section of a MOSFET switch constructed in accordance with the embodiment of FIG. 5.

FIG. 9 shows a schematic cross section of MOSFET 103 used in the embodiment of FIG. 8. Schottky diodes 112, 114 are shown connected to MOSFET 103 for the purpose of biasing the isolated P-well 116, in which the gate, source and drain components are constructed. When drain terminal 118 becomes negatively biased by input terminal 104 of FIG. 8, Schottky diode 112 becomes forward biased and Schottky diode 114 becomes reverse biased thereby pulling P-well 116 below ground 124 and preventing the natural forward biasing between N+ material 120 and P-well 116. During normal mode operation, source terminal 122 is connected to ground 124 and the accumulation of positive charge on P-well 116 is limited to the forward voltage drop of Schottky diode 114. Capacitor 126 may optionally be used to keep P-well 116 close to ground during transient events.

Figure 10:
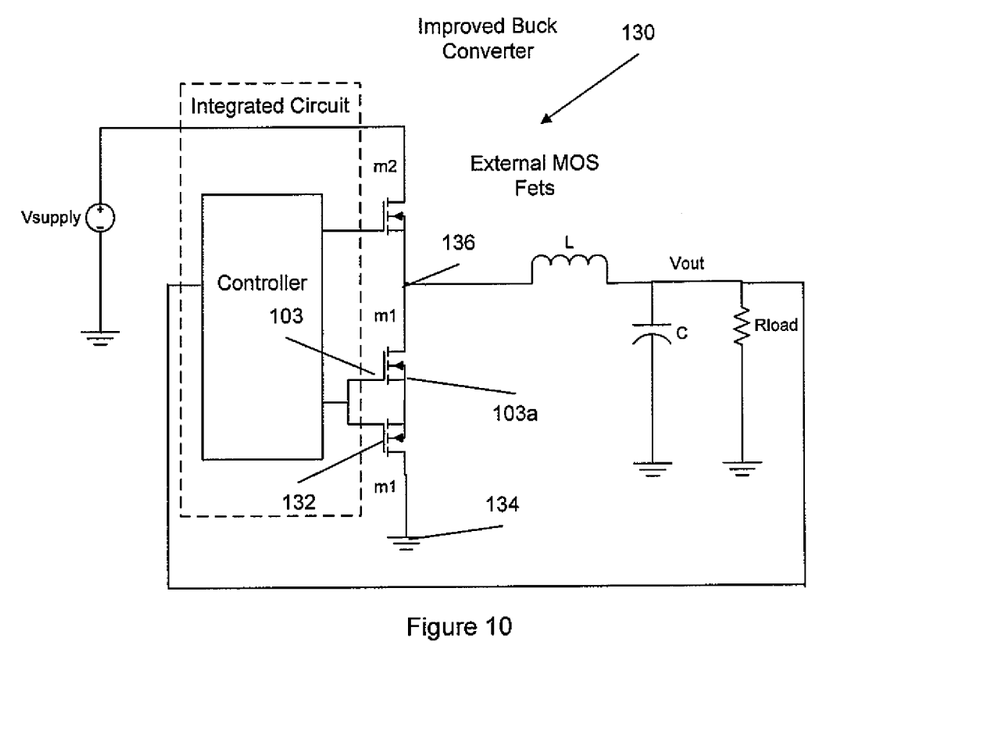
FIG. 10 is a schematic diagram of another modification of the embodiment of FIG. 7.

FIG. 10 shows a schematic diagram of a converter 130 representing a modification of the converter 100 of FIG. 7. An additional MOSFET 132 is shown connected between the source P-well terminal 103a of MOSFET 103 and ground 134. This series connection of MOSFETs 103 and 132 allows the voltage at terminal 136 to become more negative when Inductor discharge current flows into input terminal 136 towards MOSFETs 103 and 132. This causes a higher discharge current yielding faster discharge time. The result is significantly reduced output voltage overshoot over the single synchronous rectifier switch 103 of FIG. 7.

Figure 11:
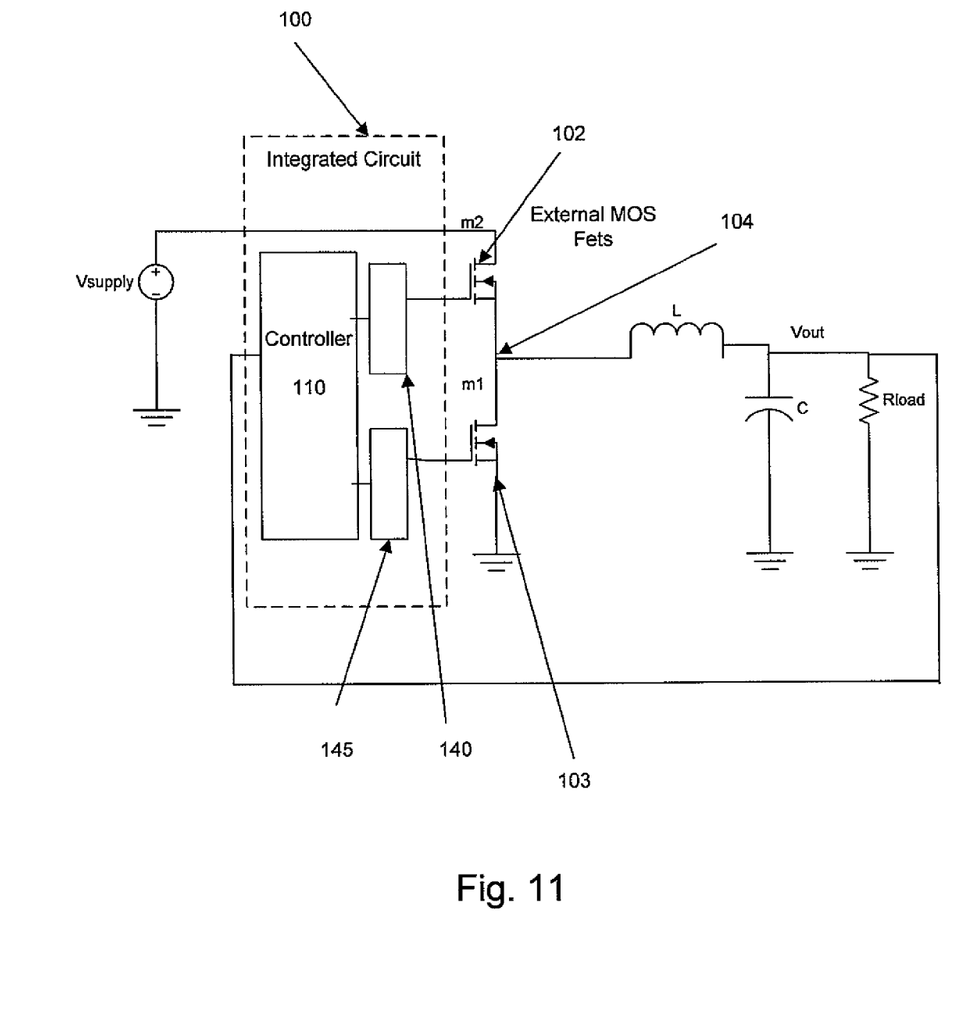
FIG. 11 is a schematic diagram illustrating a further embodiment of the present teachings.

FIG. 11 shows a schematic diagram illustrating a further embodiment of converter of the present teachings in which the converter includes a first gate driver circuit 140 for switching the first switch 102 and a second gate driver circuit 145 for switching the second switch 103. (The gate drivers can be, for example, but not a limitation of these teachings, a gate driver as described in Laszlo Balogh, Design And Application Guide For High Speed MOSFET Gate Drive Circuits, Proc. Power Supply Design Seminar (SEM 1400), 2001 or in IGBT/MOSFET Gate Drive Optocoupler, Vishay Semiconductor Application Note No. 81227 or W. Andreycak, "Practical Considerations. In High Performance MOSFET, IGBT and MCT Gate Drive Circuits", Unitrode Corporation, Application Note U-137, all of which are incorporated by reference herein in their entirety.) In one instance, the first gate driver circuit 140 and the second gate driver circuit 145 are integrated together with the controller 110 into a controller integrated circuit 100. In another instance, the second gate driver circuit 145 provides a voltage lower than a voltage at the input terminal 104 (also referred to as a source voltage). (Exemplary embodiments of a gate driver circuit providing a voltage lower than a voltage at the input terminal 104 or a negative or reverse voltage are IGBT gate driver circuit such as the IGBT gate driver circuits described in the references cited hereinabove.)

Figure 12:
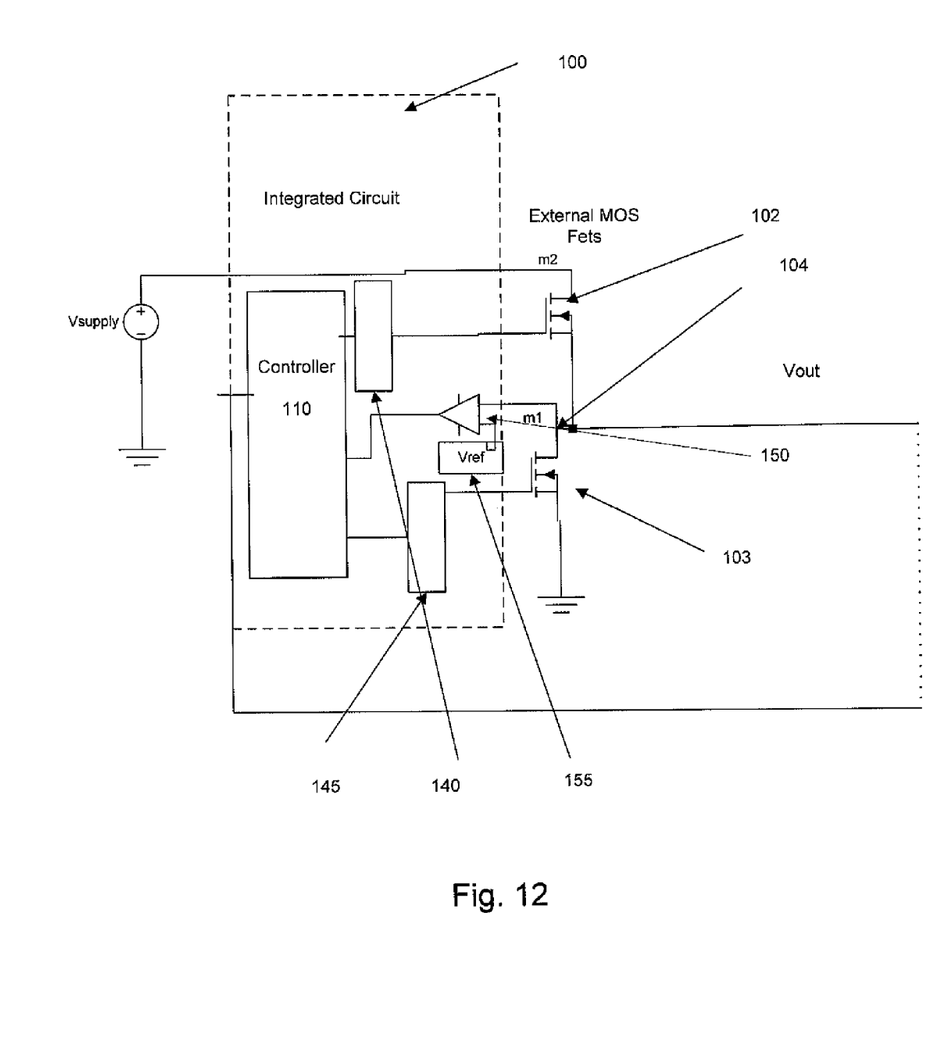
FIG. 12 is a schematic diagram of a modification of the embodiment of FIG. 11.

FIG. 12 shows a schematic diagram of a modification of the embodiment of FIG. 11 in which a comparator circuit 150 is operatively connected to the input terminal 104 and compares input terminal voltage to a predetermined voltage 155; the comparator circuit asserting a signal when the input terminal voltage increases above the predetermined voltage 155. In one instance, the controller is programmed (in one embodiment has computer readable code embodied in the computer usable medium) to provide, upon receiving the asserted signal, a turn on switch voltage to the second switch. In another instance, the controller includes a logic component that provides, upon receiving the asserted signal, a turn on switch voltage to the second switch.

It should be noted that, although many of the above described embodiments utilizing MOSFETs as the switches, these teachings are not limited only to those embodiments, and embodiments in which IGBTs, MESFETs, or a bipolar transistors are utilized as the switches are also within the scope of these teachings.

Various modifications and changes may be made by persons skilled in the art to the embodiments described above without departing from the scope of the teachings as defined in the appended claims.

What is claimed is:

1. A DC-to-DC buck converter, comprising:
an inductor coupled between an input terminal and one end of a capacitor to conduct an inductor current to the capacitor to produce an output voltage across the capacitor and provide a varying range of load current;
a first switch connecting the input terminal to a voltage source;
a second switch connecting the input terminal to ground;
the first switch and the second switch comprising a switch selected from an IGBT, MESFET, MOSFET, or a bipolar transistor;
a control circuit controlling the first and second switches and opening both the first and second switches together in order to reduce an increase in the output voltage caused by a substantial reduction in the load current;
wherein, in normal operation, the control circuit provides a normal operating sequence to alternatively connect the input terminal to either the voltage source or to ground in response to the output voltage to provide the varying range of load current; and
a bypass circuit connected across the second switch,
wherein the bypass circuit comprises a regular diode and a zener diode,
wherein an anode of the zener diode is connected to input terminal, a cathode of the zener diode is connected to a cathode of the regular diode, and an anode of the regular diode is connected to ground, and
wherein the regular diode is reverse biased during the normal operating sequence and forward biased when the input terminal exhibits a negative voltage while current through the inductor is adjusting to the substantial reduction in the load current.

2. The converter of claim 1, wherein the control circuit keeps the first switch off and modulates the second switch to reduce an increase in the output voltage caused by the substantial reduction in the load current.

3. The converter of claim 1, wherein:
the bypass circuit limits voltage across the second switch when the input terminal exhibits the negative voltage while current through the inductor adjusts to the substantial reduction in the load current.

4. The converter of claim 1, wherein the second switch is a MESFET having an isolated bulk.

5. The converter of claim 1, wherein the first and second switches and the control circuit are constructed as part of the same integrated circuit.

6. The converter of claim 1, wherein the second switch is constructed as part of a separate integrated circuit from the control circuit to enhance heat dissipation from the second switch.

7. The converter of claim 1 further comprising:
a first gate driver circuit for switching the first switch; and
a second gate driver circuit for switching the second switch.

8. The converter of claim 7 wherein the first gate driver circuit and the second gate driver circuit are integrated in a controller.

9. The converter of claim 7 wherein the second gate driver circuit provides a voltage lower than a source voltage.

10. The converter of claim 7 further comprising:
a comparator circuit operatively connected to the input terminal and comparing input terminal voltage to a predetermined voltage;
the comparator circuit asserting a signal when the input terminal voltage increases in a predetermined manner; and
the controller, upon receiving the asserted signal, providing a turn on switch voltage to the second switch.

11. A method for converting a DC voltage to a lower DC voltage, comprising:
conducting current from an input terminal, through an inductor to charge a capacitor connected to the inductor at an output terminal and to provide a varying range of load current from the output terminal;
alternately switching the input terminal between a supply voltage and a ground potential to produce a desired voltage at the output terminal that is lower than the supply voltage, while providing the varying range of load current;
disconnecting the input terminal from both the supply voltage and the ground potential to reduce an increase in voltage at the output terminal caused by a substantial reduction in the load current;
modulating the connection to the ground potential while inductor current adjusts in response to the reduced load current, while keeping the supply voltage disconnected from the input terminal;
sensing voltage at the input terminal; and
reconnecting the input terminal to ground if the voltage at the input terminal exceeds a predetermined amount,
wherein the alternately switching includes:
switching the input terminal to ground using a MOSFET having a isolated bulk;
protecting semiconductor junctions, with the isolated bulk within the MOSFET, from becoming forward biased by reverse voltage at the input terminal; and
bypassing the semiconductor junctions with individual Schottky diodes having a lower forward bias threshold voltage than the semiconductor junctions of the isolated bulk,
wherein anodes of the Schottky diodes are connected to the isolated bulk, a cathode of a first one of the Schottky diodes is connected to the input terminal, and a cathode of a second one of the Schottky diodes is connected to ground.

12. A method for converting a DC voltage to a lower DC voltage, comprising:
   conducting current from an input terminal, through an inductor to charge a capacitor connected to the inductor at an output terminal and to provide a varying range of load current from the output terminal;
   alternately switching the input terminal between a supply voltage and a ground potential to produce a desired voltage at the output terminal that is lower than the supply voltage, while providing the varying range of load current;
   disconnecting the input terminal from both the supply voltage and the ground potential to reduce an increase in voltage at the output terminal caused by a substantial reduction in the load current;
   limiting an amount of reverse voltage that can be produced at the input terminal while inductor current is adjusting in response to the substantial reduction in load current by providing, to a semiconductor switching device used to connect the input terminal to the ground potential, a gate voltage lower than an input terminal voltage; and
   the bypassing the semiconductor switching device used to connect the input terminal to the ground potential with a zener diode and a regular diode adapted to limit reverse voltage produced at the input terminal with respect to the ground potential,
   wherein an anode of the zener diode is connected to input terminal, a cathode of the zener diode is connected to a cathode of the regular diode, and an anode of the regular diode is connected to ground, and
   wherein the regular diode is reverse biased during the normal operating sequence and forward biased when the input terminal exhibits a negative voltage while current through the inductor is adjusting to the substantial reduction in the load current.

13. The method of claim 12, wherein the alternately switching includes using semiconductor devices produced in a single semiconductor substrate with control circuitry adapted to generate the alternately switching with the semiconductor devices.

* * * * *

UNITED STATES PATENT AND TRADEMARK OFFICE
CERTIFICATE OF CORRECTION

Page 1 of 1

PATENT NO.        : 8,508,205 B2
APPLICATION NO.   : 12/728458
DATED             : August 13, 2013
INVENTOR(S)       : Paul W. Latham, II et al.

It is certified that error appears in the above-identified patent and that said Letters Patent is hereby corrected as shown below:

In the Specifications:

| | |
|---|---|
| Column 1, Line 30 | Delete "thru" and insert --through-- |
| Column 3, Line 54 | Before "limiting", delete "the" |
| Column 4, Line 17 | After "terminals", insert --.-- |
| Column 4, Line 35 | After "The", insert --method-- |
| Column 5, Lines 5-6 | Delete "the than" and insert --than that-- |
| Column 5, Line 44 | Before "terminal", insert --output-- |
| Column 6, Line 4 | Delete "interval" and insert --period-- |
| Column 6, Line 14 | Delete "cause them to" and insert --causes-- |

In the Claims:

| | |
|---|---|
| Column 12, Line 1, Claim 12 | Before "bypassing", delete "the" |

Signed and Sealed this
Eleventh Day of February, 2014

Michelle K. Lee
*Deputy Director of the United States Patent and Trademark Office*